United States Patent [19]

Herrick

[11] Patent Number: 5,469,020

[45] Date of Patent: Nov. 21, 1995

[54] FLEXIBLE LARGE SCREEN DISPLAY HAVING MULTIPLE LIGHT EMITTING ELEMENTS SANDWICHED BETWEEN CROSSED ELECTRODES

[75] Inventor: Bradley R. Herrick, Marlborough, Mass.

[73] Assignee: Massachusetts Institute of Technology, Cambridge, Mass.

[21] Appl. No.: 212,411

[22] Filed: Mar. 14, 1994

[51] Int. Cl.$^6$ .............................. H01J 63/04; G09F 13/00
[52] U.S. Cl. .................. 313/511; 40/542; 40/624
[58] Field of Search ............................ 313/511, 506; 345/76, 206; 40/542, 624

[56] References Cited

U.S. PATENT DOCUMENTS

| | | | |
|---|---|---|---|
| 3,037,137 | 5/1962 | Motson | 313/511 |
| 3,924,879 | 12/1975 | Wright | 40/594 |
| 3,976,906 | 8/1976 | Shattuck | 313/511 |
| 5,016,373 | 5/1991 | Theno | 40/594 |
| 5,162,696 | 11/1992 | Goodrich | 313/511 |
| 5,317,438 | 5/1994 | Suzuki et al. | 359/88 |

*Primary Examiner*—Sandra L. O'Shea
*Assistant Examiner*—Vip Patel
*Attorney, Agent, or Firm*—Robert K. Tendler

[57] ABSTRACT

Active light-emitting components are integrated into a thin flexible plastic-wrap like film to provide an exceptionally large continuous display in which the film contains densely distributed light emitting elements addressed by a grid of transparent conductors. Inexpensive bulk processing techniques are used to produce plastic wrap with embedded components completely through the film to permit activation via a row column matrix. This topological layout provides mass redundancy of components, spatial decorrelation of component yields, and dramatic reduction in registration problems of metallic interconnects. The subject panel is especially well adapted to inexpensive flat panel TV screens or exceptionally large flat panel displays whose geometry is not limited to flat surfaces, but may take on curved or cylindrical configurations. The active element flexible film design can be used for electroluminescent tape for automotive pin striping and signage; for flexible glue-on displays and for video displays such as workstations, HDTV, theater screens and billboards.

16 Claims, 16 Drawing Sheets

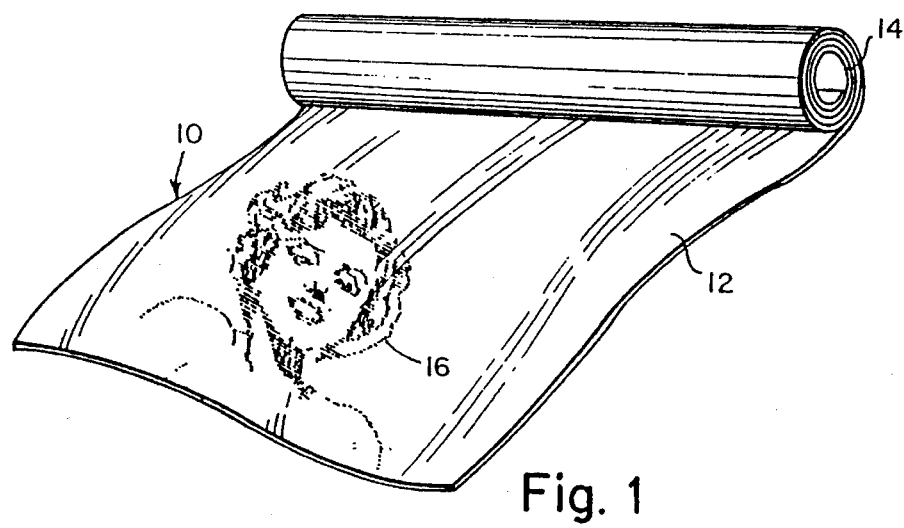
Fig. 1
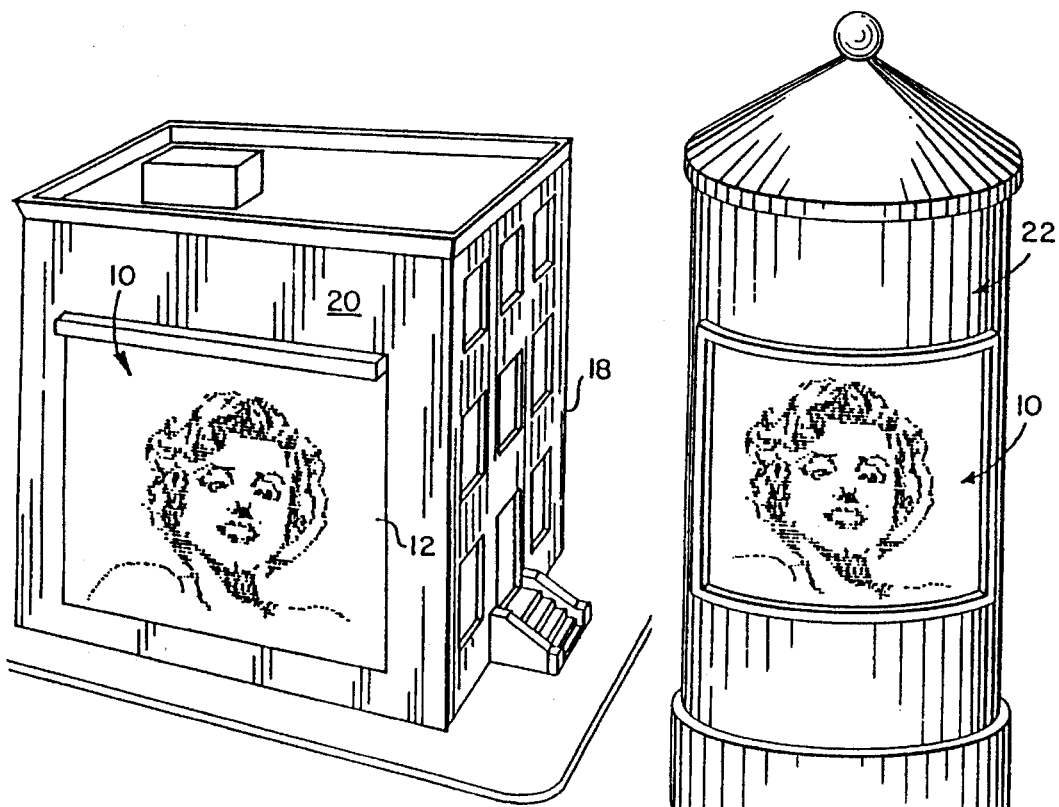
Fig. 2
Fig. 3

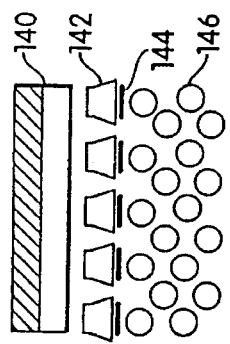
Fig. 17C
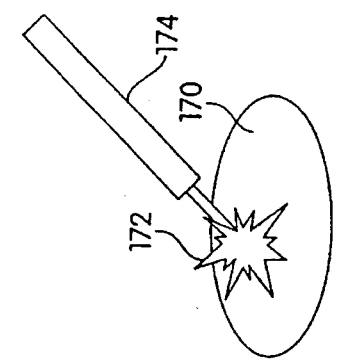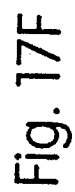
Fig. 17F
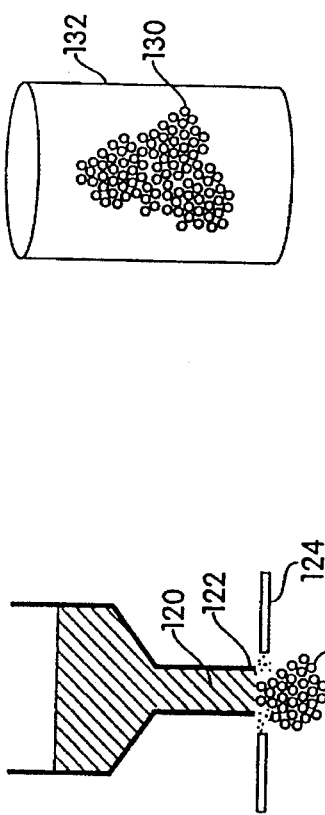
Fig. 17B
Fig. 17A
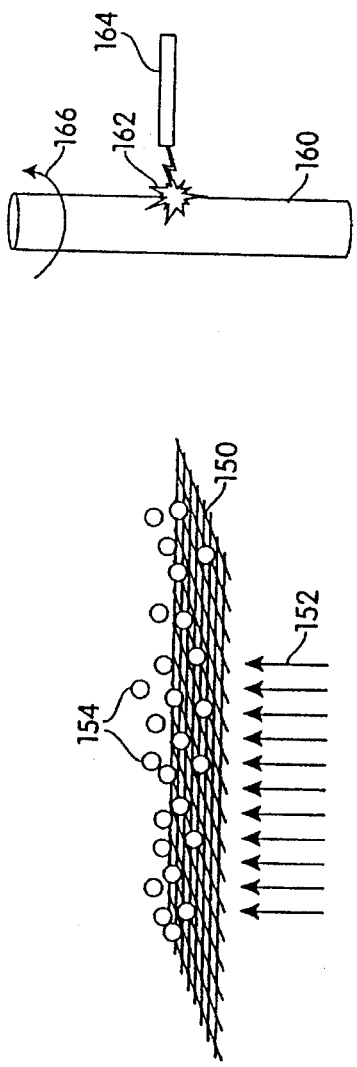
Fig. 17E
Fig. 17D

FLEXIBLE LARGE SCREEN DISPLAY HAVING MULTIPLE LIGHT EMITTING ELEMENTS SANDWICHED BETWEEN CROSSED ELECTRODES

FIELD OF INVENTION

This invention relates to displays and more particularly to exceptionally large flexible displays utilizing plastic film with embedded active display elements.

BACKGROUND OF THE INVENTION

In an effort to provide large, wall size displays, many projection techniques have been utilized in which video information is projected on to a screen. Such systems are bulky and expensive, and do not lend themselves easily to outdoor applications such as billboards, signage or where large flat screens are required. Moreover, these techniques are not well adopted to wide screen TV or theatrical applications even though there have been many attempts to do so.

There are presently efforts under way to use large scale integrated circuit technology to extend the solid state display out to much larger dimensions. This is done primarily through the use of active semiconductor elements placed in an X/Y addressable array. However, these active matrix TV techniques are not well adapted to large screen displays over more than tens of inches due to registration problems, poor yields and the requirement for the maintenance of strict manufacturing tolerances. As a result, as photolithography is applied at larger scales, fundamental problems arise which drastically impact the yield and reliability of the resulting devices. As the size and complexity of the circuits increase, this multiplicative effect can drive the yield and reliability of the circuits to unacceptably low numbers.

A second problem with applying photolithography to large screen displays is an incompatibility of scale. Producing active components requires registration of multiple masks to dimensions on the order of a micron. Unfortunately, for a 19 inch TV, a 19 inch substrate will deform due to thermal expansion so that it is impossible to properly register the masks. A technically intensive solution to this problem has been devised by MRS Technology of Burlington, Mass. in which the required TV aperture is divided into sub-apertures which are imaged separately. As the imaging system steps from one section to another it must sense the location of the previous mask layers and properly register the next mask. Together the problems with component yield and incompatibility of scale have delayed the realization of large active-matrix flat panel displays. Thus prior art large screen displays have suffered from the problems of component yield, correlation of component failures and mask registration.

As illustrated in U.S. Pat. No. 4,136,436, and by way of further background, Texas Instruments, Inc. of Dallas, Tex., has provided concentric spherical semiconductor devices embedded in a rigid epoxy used as photovoltaic sources with the use of an electrolyte. While this technique provides pn junctions in spherical form distributed across a rigid place, it will be appreciated that this technology does not result in a display and is non-flexible, precluding use in a large size application requiring an easily erectable flexible display.

SUMMARY OF THE INVENTION

In order to solve the problems of component yield, localized component failures and mask registration over large areas, individual active semiconductor devices, such as diodes, are fabricated in bulk and incorporated into a thin flexible transparent plastic film which is subsequently metallized with a transparent array of electrodes. This produces a flexible display of plastic wrap type material which can be rolled up and unrolled for the particular application, with flexibility being a key factor.

In one embodiment, the devices are micron-size particles distributed in the film as a powder when the plastic sheet is made, such that large numbers of active devices are addressed by a single pair of crossed X/Y buses which are part of the row-column addressing structure. Because of the large number of active devices at a row-column junction, the display is immune to individual active device failure.

In a preferred embodiment, the active components extend through the film to permit metallization on both surfaces of the film to provide interconnects. Moreover, by fabricating the individual devices first, their yield is no longer tied to registration problems which depend on the scale of the final circuit. Also, since the devices are formed in bulk, their positions in the final circuit become randomized when distributed in the plastic film, thereby removing any spatial correlations in the device failures.

More specifically, in one embodiment, spherical diode elements are formed as a powder having diameters on the order of 5 microns–2 mm. These formed elements are distributed across the film as it is being formed, with an electric field used to orient the diodes as the plastic film is formed. Thereafter, appropriate metallization is applied.

Alternatively, silicon spheres can be embedded in the film, without diode junctions being formed. Thereafter the spheres can be activated to produce visible light by an etching process which forms microchannels in the spheres. When a voltage is applied across the etched spheres, they emit light without the necessity of initially forming a pn junction.

Importantly, the final product is a continuous, flexible, transparent film which is easily fabricated through the use of continuous film forming technology.

Note that reliability is provided by interconnecting many discrete devices in parallel to provide redundancy. This is made possible through the use of micron-size spheres and buses which activate large numbers of spheres. Considering the application of this technology to TV screens, a film of LED's or other luminescent devices is created and row and column lines are provided on either side. Where the lines happen to cross the devices, they are interconnected and a "pixel" is formed. Clearly this process requires no registration since misalignment of either set of lines will only shift the effective pixel location.

In one embodiment, there are fundamentally four steps which are used to produce flexible extended films with embedded light-emitting elements. First, devices are fabricated in a bulk process. Secondly, these devices are incorporated in a plastic material and formed into a film. Thirdly, the active devices are aligned in the film or are such that they emit light in a given direction with respect to the film. Fourth, both sides of the film are metalized to provide a row-column structure.

Note that Chemical Vapor Deposition (CVD) which is commonly used in the fabrication of integrated circuits may be used in device formation, specifically amorphous light emitting diodes or LED's. Note also that spherical devices can be formed by fabricating thin SiC:H layers which are removed from the substrate and ground to form spherical devices with diameters on the order of 5–10 microns.

As mentioned above, when it is inconvenient to orient the active devices in the film during film formation, suitable active elements can take the form of porous silicon light-emitting diodes in the form of spheres embedded in the flexible film and etched with hydroflouric acid to produce the required porous material. It has been found that these microporous spheres have the same photoluminescent behavior as the original wafer.

Other active elements include the manufacture of electroluminescent phosphors for thin film displays or diodes produced by the annealing of semi-molten p and n spheres.

There are currently several common processes for commercially producing thin plastic films, namely, casting, stretching and blowing. The process of casting involves a process in which the plastic is extruded through narrow die-lips and is cooled either by passing over a chilled roller or through a water bath. The film can be made thinner and the polymers more oriented by stretching or "drawing" the material. The process in which the cast film is stretched in two dimensions below its melting point includes inlet rolls, exit rolls and grippers to stretch the film as it moves between rolls. This process produces films, primarily of polyethylene terephthalate, PET, and polypropylene, PP, with thicknesses ranging from 20 microns to 2 mm.

Alternatively the films can be formed by film blowing; either melt film-blowing or biaxial-draw film blowing. Film blowing is used to produce thin sheets of plastic more rapidly and economically than the casting process, and has been in widespread use in producing plastic wrap and garbage bags. As will be appreciated, film blowing can create films with thicknesses of 6 microns.

In one embodiment, the melt film-blowing process is modified for producing extended films as follows. The molten plastic, including the active devices, is extruded through an annular die creating a cylindrical film. This film is drawn upwards, or downwards, through a cylindrical capacitor which is added to the process to orient the active components. Air is injected about the film for cooling and inside the film to "blow" or expand the film radially. At a point, the film cools below the melting point and it is then constrained in one dimension by guide rolls, after which it is wound on a take-up reel. Note that the initial extrusion may first be cooled below the melting point and then heated just above the melting point prior to drawing and blowing.

It will be appreciated that as an alternative process, another blown film technique can be used which involves fixing a cast film over a fixture and blowing it into a "bubble".

As to diode junction orientation, although there are several ways to orient components in a flexible film, in one embodiment, an electric field is used to orient an active component by taking advantage of the dipole moment of the depletion region. When a cylindrical capacitor is used in the film-blowing process, as the film is drawn between the walls of the capacitor, the electric field acts to rotate all the individual active devices into alignment because of the built-in electric field across the depletion region of each device. The process is designed so that the field is strong enough, the plastic viscosity low enough, and the take-up rate slow enough to insure that the devices are properly oriented as they exit the capacitor.

As mentioned above, another method to achieve electroluminescence is through the utilization of spheres of silicon first embedded into the flexible plastic sheet and then microetched with hydroflouric acid to produce active devices which, upon application of an electric current emit radiation in the visible portion of the electromagnetic spectrum. It has been found that light is emitted under such circumstances without the need for doping. The advantage to this process is that the active devices need not be manufactured in bulk and oriented during film manufacture. Rather, the spheres may be added to the material used to make the plastic film prior to film formation, with the top of the spheres being exposed after film formation to the microetchant imparted to the spheres from a top surface of an already formed film. Thus active element orientation need not involve the application of orienting electric fields.

In summary, what is provided is a flexible transparent film with active elements imbedded in a dense random distribution in the film. The individual active devices are activated via a matrix of buses which may be transparent and which are laid across the elements, with the elements extending from one surface of the flexible sheet to the other. Note that the top and bottom sides of the elements are connected from the top and bottom of the sheet via the use of appropriate metallization, such that the elements lie between the crossed buses to produce light.

It will be appreciated that the flexible display has application as electroluminescent tape for automotive pin striping and sheet material for signs. The displays may be provided as a flexible glue-on sheet in the automotive field for dash and windshield applications. This same glue-on sheet can be utilized in the home product market for clock displays and appliance displays. The glue-on sheet can be utilized in advertising for printed signs and billboards and in the novelty field for static curved displays on cups and glasses or other tableware.

Finally, the subject flexible sheets may be utilized as video displays, for work stations, in home HDTV, for theaters and for outdoor size billboards.

BRIEF DESCRIPTION OF THE DRAWINGS

These and other objects will be better understood taken in conjunction with the Detailed Description in conjunction with the Drawings of which:

FIG. 1 is a diagrammatic representation of the utilization of a flexible plastic sheet with embedded light emitting elements to produce a large screen display in such a manner that the display material can be rolled up and distributed from a roll;

FIG. 2 is a diagrammatic illustration of the utilization of the subject display across the face of a building, illustrating the scale to which such displays may be utilized;

FIG. 3 is a diagrammatic representation of a kiosk on which the subject display is affixed, illustrating the flexibility of the display and its use around cylindrical or other mounting substrates;

FIGS. 17A–17F illustrate various methods of sphere formation, respectively, gas atomization, chemical sphere formation by accretion to form micro balloons, mask-etch-dicing, fluidized bed sphere accretion, rotating electrode ablation and laser ablation;

DETAILED DESCRIPTION

Figure 4:
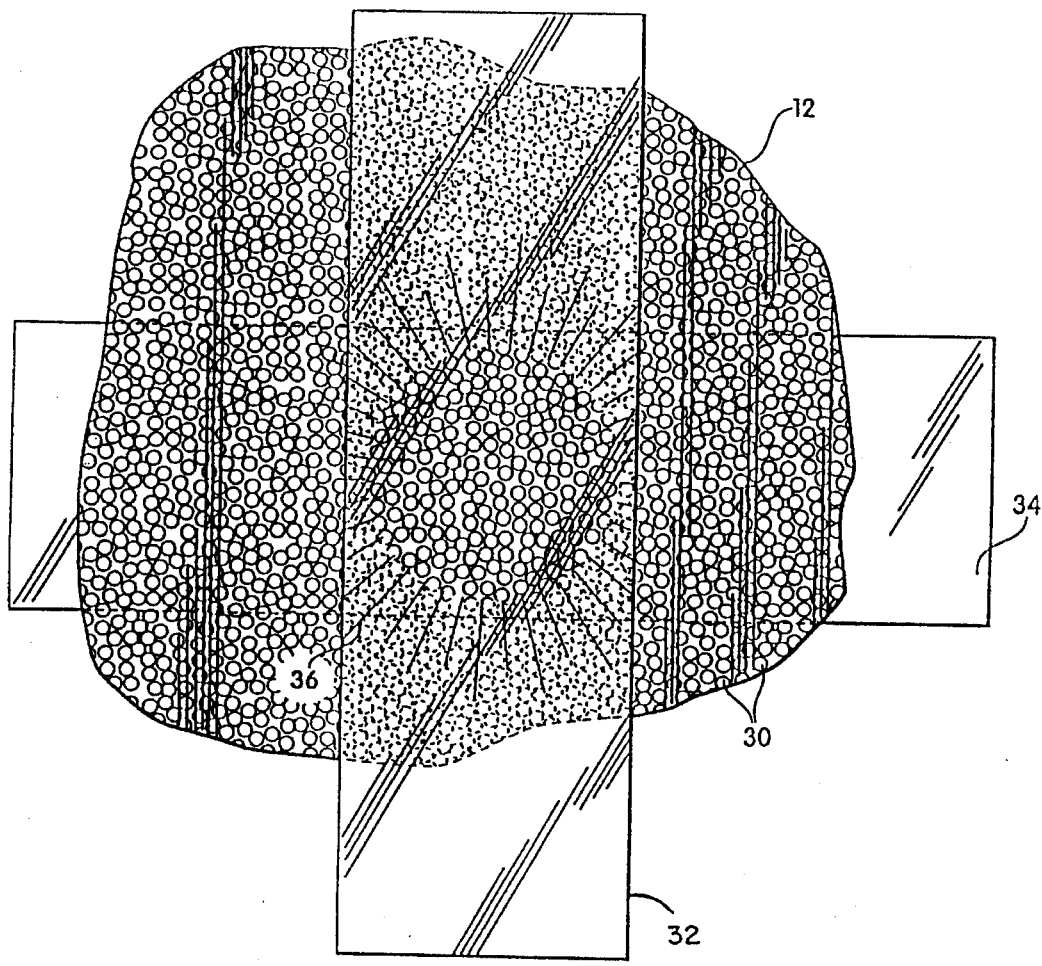
FIG. 4 is a top and diagrammatic view of a portion of the subject display illustrating a portion of film carrying micron-sized elements sandwiched between crossed electrodes such that those elements at the junction of the crossed electrodes are activated with the application of appropriate voltage.

Referring now to FIG. 1, a flexible display 10 includes a flexible sheet 12 provided in a roll 14 in which micron sized active elements are imbedded in the sheet, with the sheet having an array of electrodes metalized top and bottom to be able to actuate the active elements for providing an image 16 across the surface of the sheet. It is the purpose of the subject display to provide anything from a small size display to a billboard-size display through the utilization of the flexible material which, in one embodiment, resembles transparent plastic wrap. As will be discussed, embedded in the plastic wrap there is a randomly distributed powder-size formation of active elements, with literally dozens of elements activated to emit light at a crossed junction of activating electrodes or buses.

Rather than having each element addressed by a single bus, in the Subject Invention, multitudes of active elements are addressed at a single bus crossover such that relatively large displays may be fabricated without regard to active device yield, or in fact the exact location of the active devices relative to the overlying and underlying bus matrix.

Referring to FIG. 2, such a display may be building-size as illustrated by building 18 such that the sheet 12 may be draped down over the side wall 20 of the building. Heretofore, such displays have been fabricated with individual light emitting devices, with each activated by its own set of electrodes. The size of the display is of course determined by the size of the light emitting elements or lightbulbs. Note that the size of the light emitting area is determined solely by the width of the electrodes which activate the elements, with the elements sandwiched between the crossed electrodes being that which makes up the pixel of the image to be displayed.

Referring to FIG. 3, a kiosk 22 is illustrated with display 10 wrapped around the surface of the cylindrical portion of the kiosk. It will be appreciated that due to the flexibility of the display, the display may be utilized for non-flat applications.

Referring now to FIG. 4, it will be appreciated that sheet 12 is illustrated with a random distribution of active elements 30, with those elements that are activated being in the overlap between electrode 32 and electrode 34. This region of electroluminescence or light emitting is illustrated via lines 36.

Figure 5:
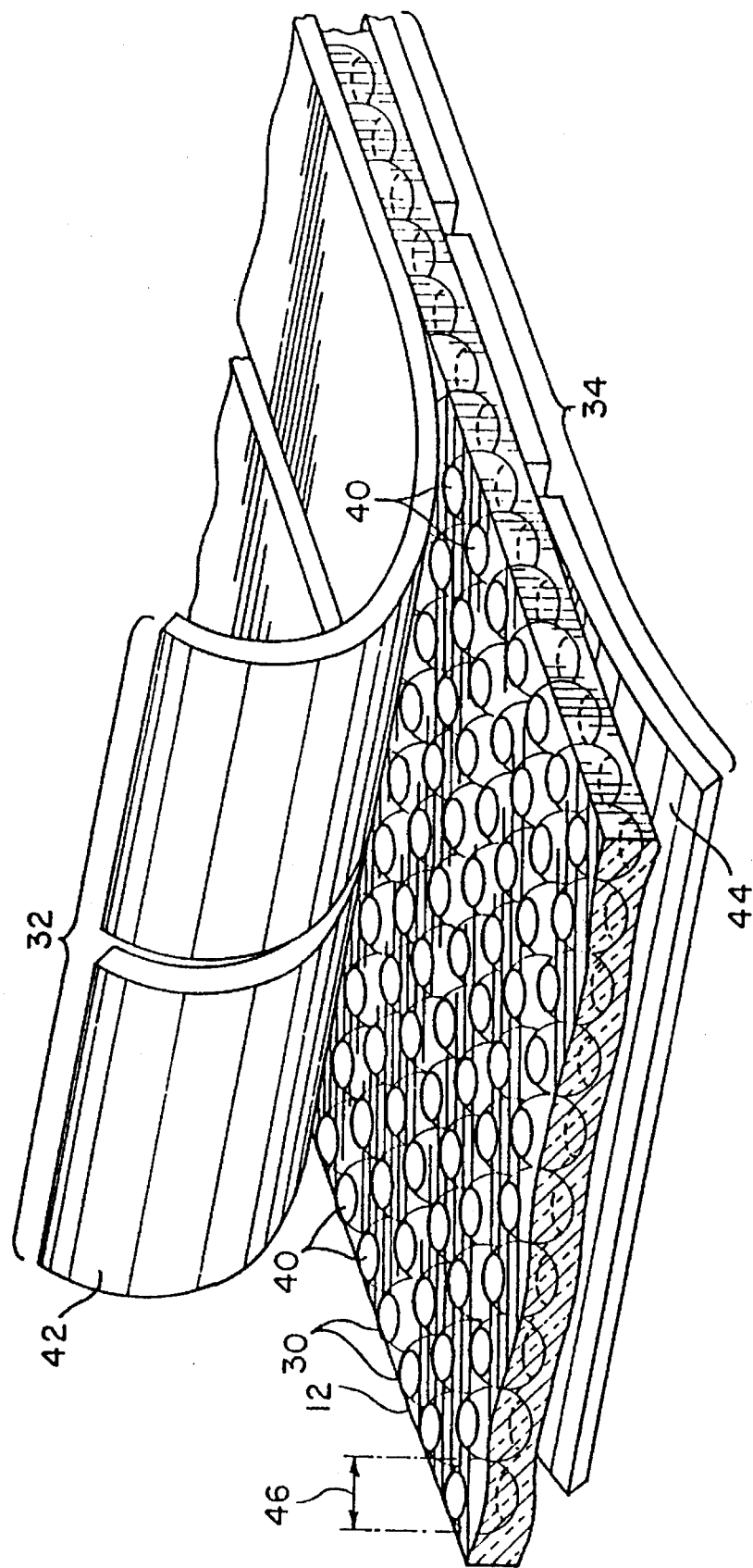
FIG. 5 is a diagrammatic illustration of the subject display illustrating the imbedding active elements within a flexible sheet, with the active elements being exposed at the top and bottom surfaces of the sheet which are adapted to be contacted via overlying electrodes in the form of buses.
Figure 6A:
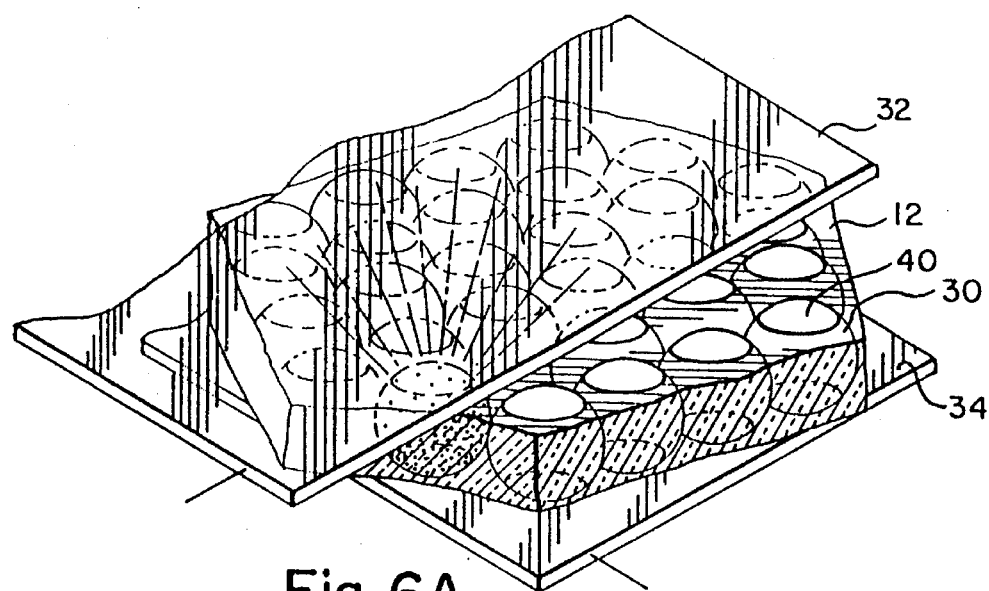
FIGS. 6A and 6B are, respectively, isometric and top views of a portion of the subject display, illustrating the sandwiching of multiple micron sized active elements in a plastic sheet surrounded top and bottom by appropriate electrode buses.
Figure 6B:
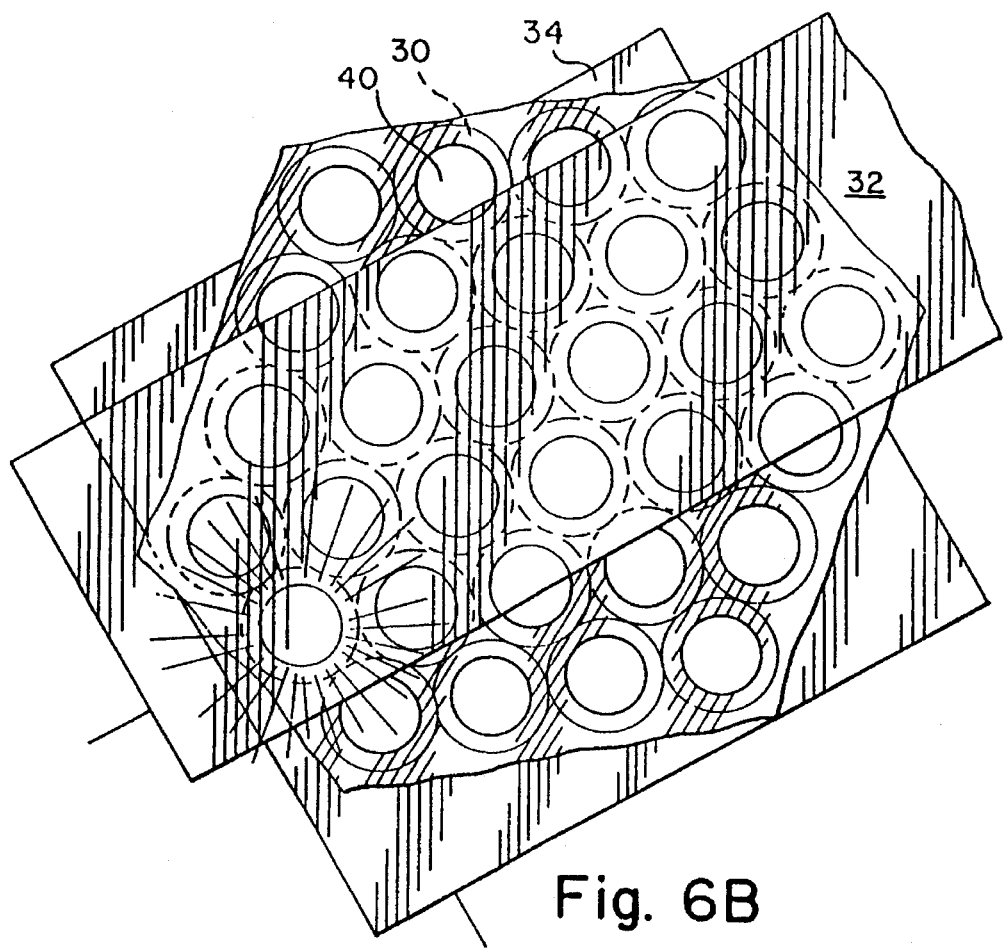

Referring to FIG. 5, 6A and 6B film 12 is shown illustrated with spherical active elements 30 being exposed at top portions 40 to be contacted via the under side 42 of electrodes 32. Top side 44 of electrodes 34 contact the portions of the active elements 30 exposed at the bottom surface of film 12 to provide row-column activation.

Ideally, the mean diameter of the spheres is on the order of 5 to 10 microns to provide maximum resolution for a display or more importantly to provide more dense packing of the individual active elements. However, it is useful sometimes to have the mean diameter be as much as two millimeters.

Figure 7:
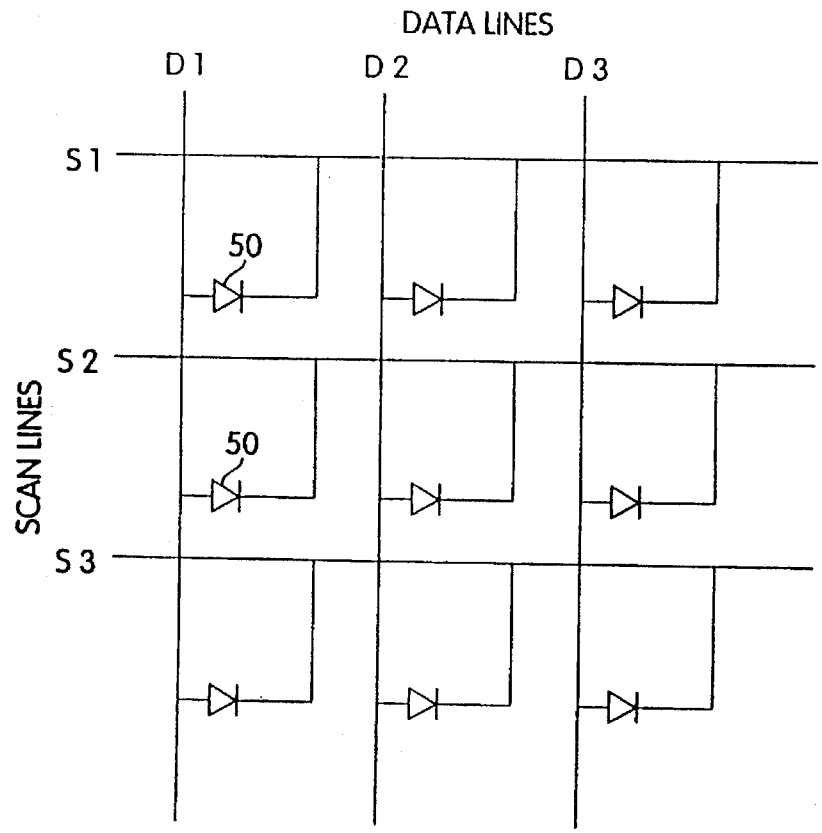
FIG. 7 is a schematic diagram illustrating the addressing of diodes within the matrix utilizing scan and data lines.

Referring now to FIG. 7, the schematic diagram shows diodes 50 addressed via data lines D1, D2 and D3 and via scan lines S1, S2 and S3. It will be appreciated that the above data and scan lines are conventional for the activation of individual diodes.

Figure 8:
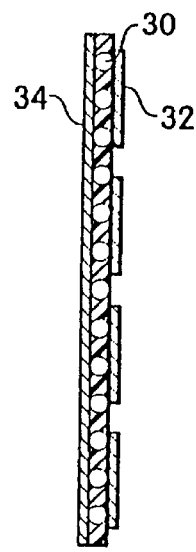
FIG. 8 is a sectional view of the subject display in which the diodes of FIG. 7 are addressed via overlapping and staggered electrodes on opposite sides of the flexible sheet.

As illustrated in FIG. 8, multiple diodes are activated at the intersection of crossed electrodes. Here, the sandwich structure shows active elements 30 addressed by electrodes 32 and 34 corresponding to the above-mentioned data lines and scan lines.

Figure 9:
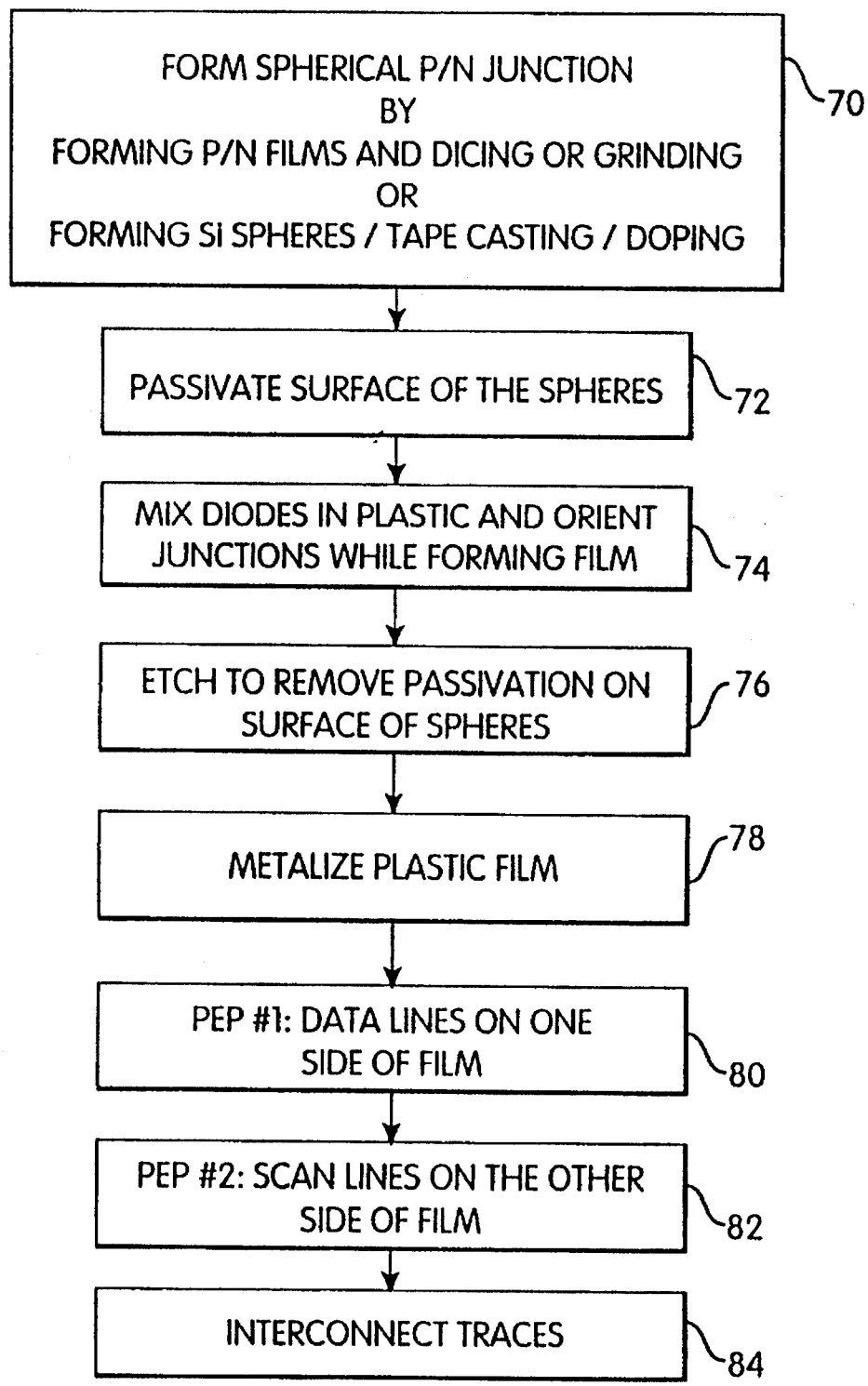
FIG. 9 is a flow chart illustrating one embodiment of the fabrication of active elements in a film in which spherical pn junctions are first formed with the resulting diodes subsequently being mixed into plastic and oriented during film forming.

Films of light-emitting diodes can also be produced and used to produce full color flat panel displays. Note three separate films of red, green and blue LED's can be bonded to a transparent or reflective panel to produce a display. Electroluminescent displays can also be fabricated by using electroluminescent material in place of LEDs as the spheres in the film. Referring now to FIG. 9, a flow chart is illustrated for the fabrication of active devices in the form of diodes. The spherical p/n junctions are formed as illustrated at 70 by either forming p/n films and dicing or grinding the film, or by forming silicon spheres, utilizing tape casting, or utilizing doping. As illustrated at 72, the surfaces of the spheres are passivated after which they are mixed as illustrated at 74 in the raw plastic and oriented such that the junctions are all in one direction while forming the film. Then passivation is removed on the surfaces of the spheres to provide contact locations for the overlying electrodes as illustrated at 76. Thereafter metallization films are formed over both sides of the sheet, with selective etching as illustrated at 80 and 82 forming data lines on one side of the film and scan lines on the other side.

More particularly, for the diode-matrix implementation, a single diode film is metallized with data lines on one side and scan lines on the other. The scan lines are metallized on the back of the liquid crystal and the two bonded. In one embodiment, addition of a color mask, driving circuitry and back lighting produces a full color display. It is important to note that transparent metallizations such as indium-tin-oxides (ITO) are currently used to form data and scan lines for such applications.

Thus, as to metallization and passivation of the plastic film, Indium-tin-oxide (ITO) may be used in the fabrication of displays where it is essential that light pass through the metallization layer or layers. For applying metal to plastics as indicated by the article by E. Miller, Plastics Products Design Handbook, Marcel Dekker Inc., New York, 1983, pp. 211–221 is instructive. Conductive polymers are also a candidate for interconnecting the active components as described in the article by P. Stipp, "Scientists Say They Increaased Electricity That Plastic can Conduct by a Factor of 10", The Wall Street Journal, Thurs. Mar. 19, 1992.

Figure 10:
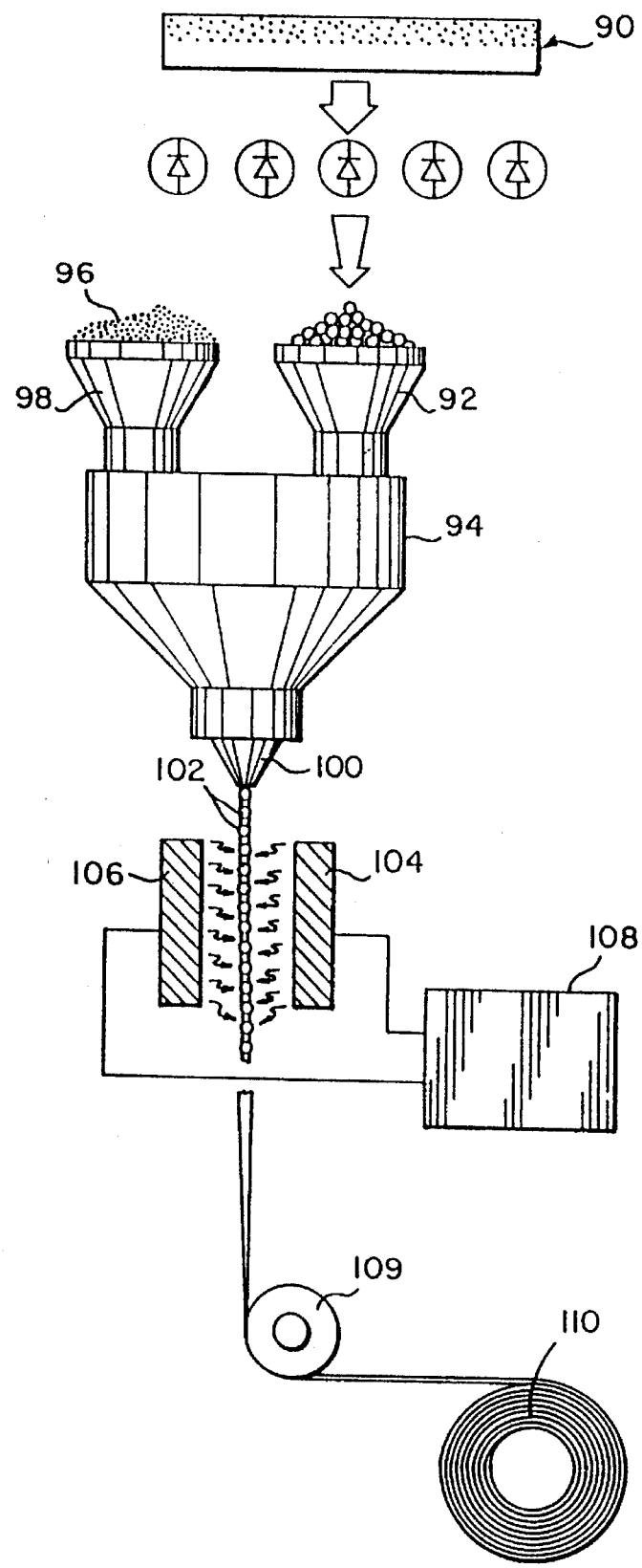
FIG. 10 is a diagrammatic illustration of one embodiment of film forming in which diode spheres are mixed with the granular material utilized to make the plastic film, with the subsequent mixing and heating resulting in an extruded film, and with the spheres being oriented via an electrostatic field during the cooling process in which the final film is formed.

Referring now to FIG. 10, in order to provide oriented active devices in a film, in one embodiment, active devices are first manufactured as illustrated at 90, where they are placed in a hopper 92 connected to a mixer or oven-type configuration 94 which mixes these active devices with granulated plastic material 96 in hopper 98, such that when mixed and extruded at die lip 100 individual active devices 102 exit the die lip in non-oriented form. As the film cools it moves away from die lip 100 and an electric field is applied via electrodes 104 and 106 to provide an electrostatic field via the application of a voltage from voltage source 108. The die lip 100 may be linear or circular in cross section. As will be described hereinafter, the subjecting of the active devices to an electrostatic field orients the devices such that they are all oriented in one direction with the junctions being generally along the center line of the film. After cooling, the film is extracted via a roll 109 and provided in roll form 110 as illustrated.

Figure 11:
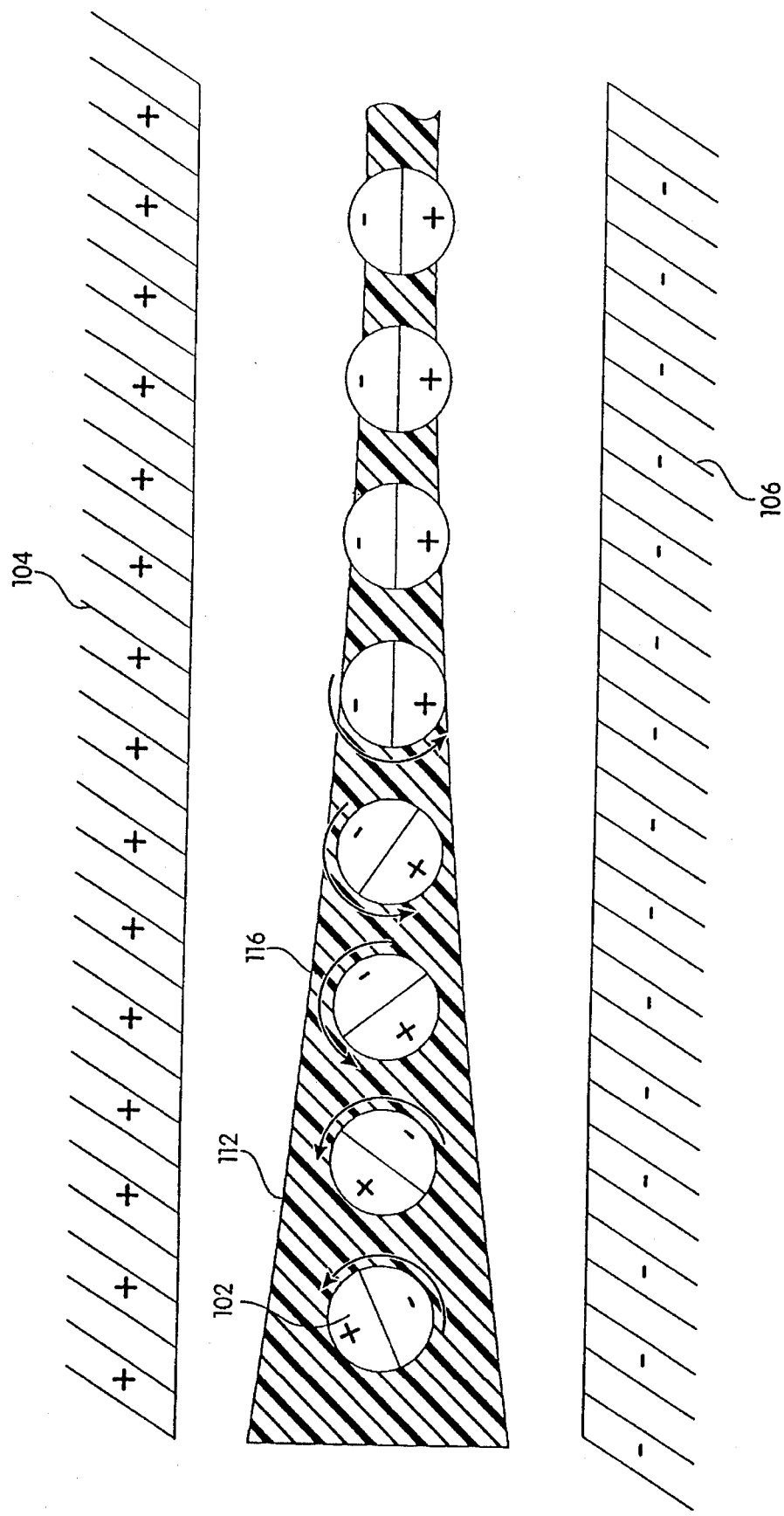
FIG. 11 is a diagrammatic illustration of device orientation during film formation in which the active elements are rotated via the application of an electrostatic field, with the final position such that opposite pn portions of the spheres are exposed at the top and bottom surfaces of the finally formed film.

Referring now to FIG. 11, as can be seen, positively charged electrode 104 is located and spaced adjacent to negatively charged electrode 106, with film 112 initially carrying unoriented devices 102 that have a built in dipole moment derived from prior doping. These devices are rotated as illustrated by arrow 116 due to the electrostatic field while the film is still fluid as it cools. What is now presented is an explanation of the action of electrostatic field on the individual active elements indicating the mechanism by which the elements can be rotated.

The subject flexible thin film active device structures permit many flat panel designs to be inexpensively produced using flexible extended films to form active circuits for liquid crystal displays (LCDs), full color light emitting diode displays (LED) and electroluminescent displays. Note that active matrix displays can be designed in a diode-matrix configuration.

The following is an analysis of active device orientation using an electric field. The electric field induces several forces on the individual active components. The first is a torque on the dipole moment which results from the built in electric field of the depletion region. The second is a torque on the dipole moment induced by the electric field acting on a slightly non-spherical dielectric. These forces are opposed by the moment of inertia of the particle and the viscosity of the plastic. The viscosity of the plastic depends on its temperature we well as the local strain placed on the plastic by the drawing process and rotation of the particles. As the film is drawn to a thickness near the diameter of the particles, the effects of surface tension may also play an important role.

Figure 12:
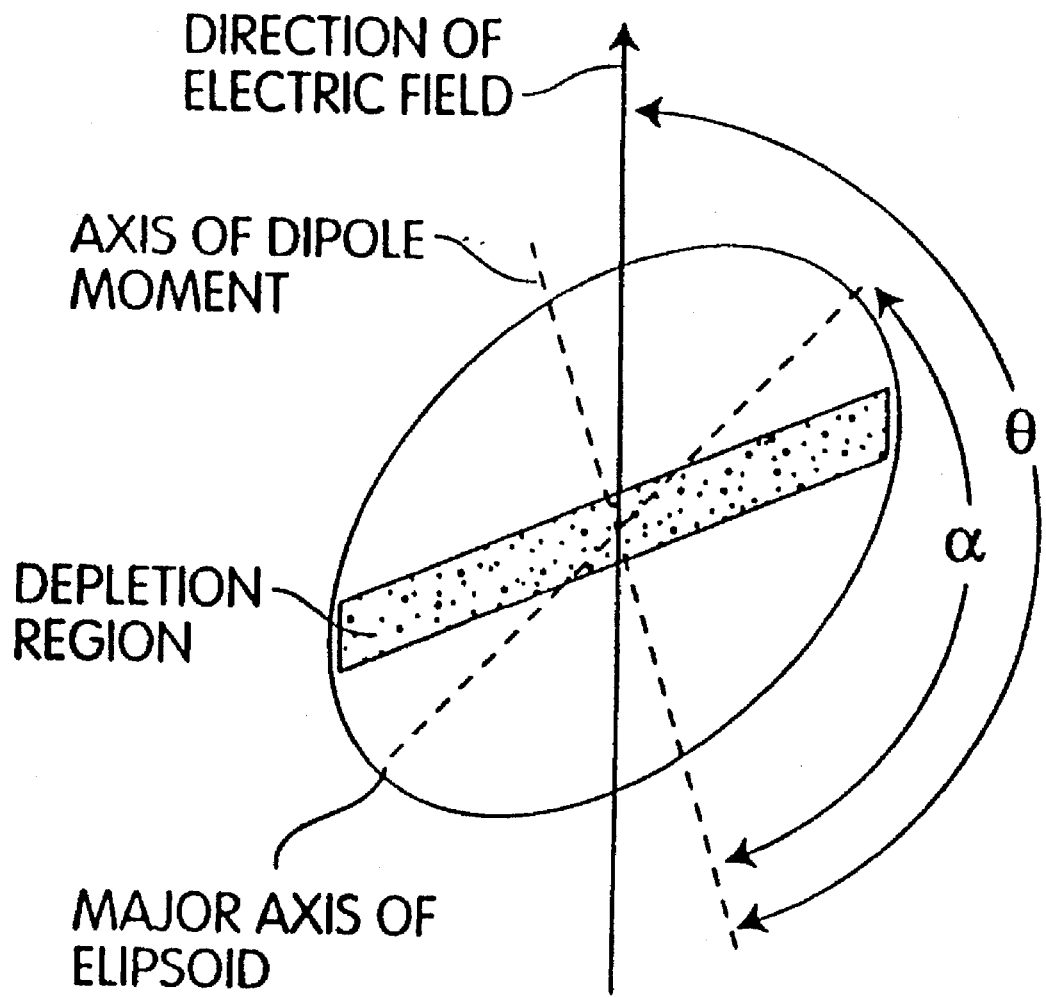
FIG. 12 is a diagram illustrating forces induced on an active device by an applied field.

FIG. 12 illustrates the forces induced on the particle by the electric field. The dipole moment (p) of the device junction can be estimated as the product of the surface charge density $=$), the area of the junction ($A=\pi r^2$), and the effective width of the junction (w). Based on nominal parameters for a p-n junction the dipole moment of a 10 micron diameter sphere can be estimated at $10^{-20}$ (coul-m). The torque on this sphere, given in equation (1), would then be: ($10^{-20}$ E sin θ).

$$\tau_j = p \times E = pE\sin\theta \quad (1)$$

$$\tau_e = \frac{(\epsilon_r - 1)^2 |1 - 3n|(4\pi\epsilon_0)E^2 V \sin 2(\theta - \alpha)}{8\pi[n\epsilon_\gamma + 1 - n][(1 - n)\epsilon_\gamma + 1 + n]} \quad (2)$$

$$\tau_e \equiv \left(\frac{9}{8}\right) |\gamma| \epsilon_0 E^2 V \sin 2(\theta - \alpha) \quad (3)$$

where:

p is the dipole moment of the depletion region

E is the applied electric field $\epsilon_o$ is the free space permittivity ($8.85 \times 10^{-12}$ F/m)

$\epsilon_r$ is the relative dielectric constant of the sphere (−10)

n is the depolarization coefficient along the axis

γ is a redefinition of n: (γ=1−3n)=0.8× (% asymmetry)

V is the volume of the sphere

θ is the angle between the dipole moment and electric field

α is the angle between the dipole moment and major axis of the ellipsoid as described in FIG. 12.

The torque induced by the electric field on an asymmetrical spheroid is well known and is expressed in equation (2). I have simplified the equation given in the reference first by converting from gaussian units to MKSA units (as in equation (2)) and then by making the substitutions: (γ=1−3n) and ($\epsilon_r$=10) as given in equation (3). Assuming a nominal diameter of 10 microns and 12% asymmetry (γ=0.1), the torque on the induced dipole moment is: ($6 \times 10^{-27}$ $E^2$ sin 2(θ−α)). It is very important that the induced torque is much less than the torque on the junction so that the junction of the active device will be vertically aligned rather than the axis of the ellipsoid (which may be random relative to the junction).

The rate at which the sphere can be rotated by these torques depends on the rotational inertia of the sphere and the drag of the molten plastic about the sphere (angular acceleration=torque/rotational inertia). The rotational inertia of the sphere is given in equation (4).

$$I = \frac{8\pi}{15} \rho R^5 \quad (4)$$

Where:

I is the rotational inertia $\rho$ is the density of the material (~5×10³ kg/m³ for silicon)

R is the radius of the sphere (5 microns in our example case)

With these assumptions the rotational inertia is 2.6×10⁻²³ kg m².

Figure 13:
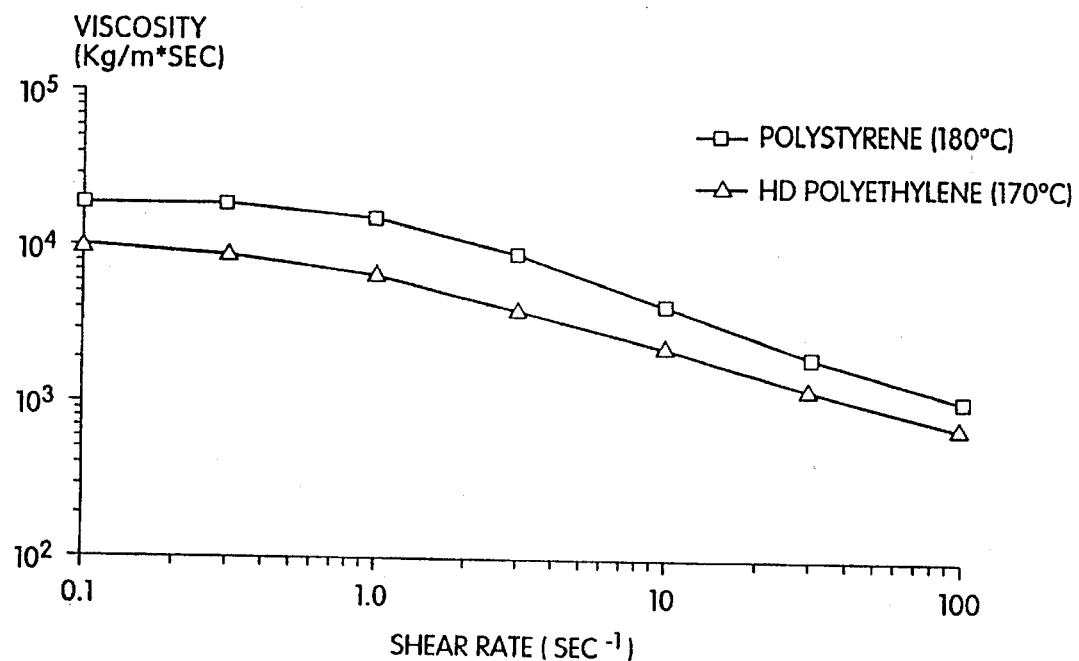
FIG. 13 is a graph illustrating the viscosity of polystyrene as a function of sheer rate at 180° C.

The remaining question is the drag placed on the sphere by the molten plastic. The choice of: plastic material, extrusion temperature, draw rate and cooling rate will all effect the viscosity of the material during particle alignment. The choice of material is not a simple one. Although linear low-density polyethylene (LLDPE) is commonly used in the production of thin films and can be blown to thicknesses of 6 microns, its melting temperature may make it inappropriate for application with active components with high junction temperatures. Polystyrene is more frequently used in electronic packaging. For an estimate of the viscous drag on the spheres we can use the data in FIG. 13 for polystyrene. Plastics are non-Newtonian fluids meaning that their viscosity is actually dependent on the rate of sheer ($\gamma$). This dependence is illustrated in FIG. 13.

Temperature can plan an important role in the viscosity of a molten plastic. Equation (5) provides a means of extrapolating viscosity data over a range of temperatures which exceed the melting point ($T_g$).

$$\eta_0 = (\eta_0) \exp \left[ \frac{-17.44(T - T^g)}{51.6 + (T - T_g)} \right] \quad (5)$$

Where:

$\eta_o$=viscosity $T_f$=melting point in °C. (100° C. for Polystyrene)

$n_o$=reference viscosity

T=Temperature in °C.

For our application, we will take a nominal viscosity of n=10⁵ (gm/cm-sec)=10⁴ (kg/m-sec) at 180° C. as our reference. Extrusion temperatures for polystyrene can range from 200°–500° C. Using equation (2) and our assumed nominal viscosity of 10⁴ (kg/m-sec), we can anticipate a range of viscosity of 10²–10⁴ (kg/m-sec).

The next step in the analysis is to formulate an expression of the torque induced on a rotating sphere by the viscosity of the molten plastic. A solution to this problem can be found through the use of the Navier-Stokes equations. One closed form solution which can be used to approximate the above problem is the solution to a rotating cylinder in an infinite Newtonian fluid.

Figure 14A:
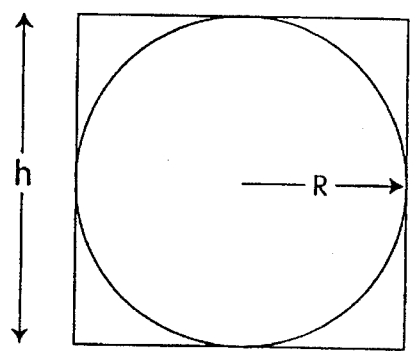
FIGS. 14A and B are diagrams illustrating two approximations to the induced torque on a sphere rotating in a fluid involving a sphere inscribed in a cylinder and many cylinders used to approximate a sphere.

As shown in FIG. 14(a) illustrates the above-mentioned sphere inscribed in a cylinder of equal radius and height equaling 2R. The solution is $$\tau_v = 4\pi\mu h R^2 \omega, \quad (6)$$

where:

$\tau_r$ is the induced torque due to viscosity, $\mu$ is the viscosity of the fluid, h is the height of the cylinder, R is the radius of the cylinder, $\omega$ is the angular velocity of the cylinder.

When equation (6) is applied to the cylinder in FIG. 14(a) the result is:

$$\tau_v = -\epsilon\pi\mu R^3 \omega. \quad (7)$$

Figure 14B:
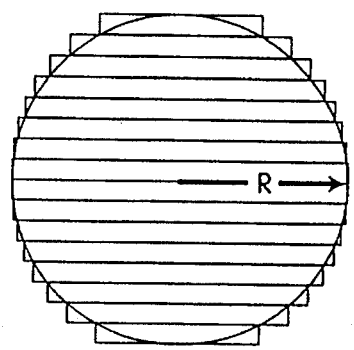

The minus sign has been added to indicate that the resulting torque acts in opposition to the rotation of the sphere. It seems reasonable to assume that the induced torque on the cylinder would exceed the torque induced on the inscribed sphere. In order to improve the estimate, the sphere is assumed to be constructed from many thin cylinders as illustrated in FIG. 14(b). The effective torque is then computed by integrating over the many small cylinders to arrive at the estimate in equation (8).

$$\tau_V = -\frac{16\pi}{3} \mu R^3 \omega \quad (8)$$

We can now use equations (1), (3), (4) and (8) to estimate the equation of motion of the sphere in an external electric field. Equation (9) gives the basic equation of motion and equation (10) makes the substitutions derived earlier. Note that ($\omega=\dot\theta$).

$$\tau_j + \tau_c + \tau_v - I\ddot\theta = 0 \quad (9)$$

$$\pi\sigma w R^2 E \sin\theta + \frac{27\pi\epsilon_o I\gamma}{16} R^3 E^2 \sin 2(\theta - \alpha) - \frac{16\pi}{3} \mu R^3 \dot\theta - \frac{8\pi\rho}{15} R^5 \ddot\theta = 0 \quad (10)$$

If we divide through by ($\pi R^2$) we obtain equation (11).

$$\sigma w E \sin\theta + \frac{27\epsilon_o I\gamma}{16} R E^2 \sin 2(\theta - \alpha) - \frac{16}{3} \mu R \dot\theta - \frac{8\rho}{15} R^3 \ddot\theta = 0 \quad (11)$$

Figure 15:
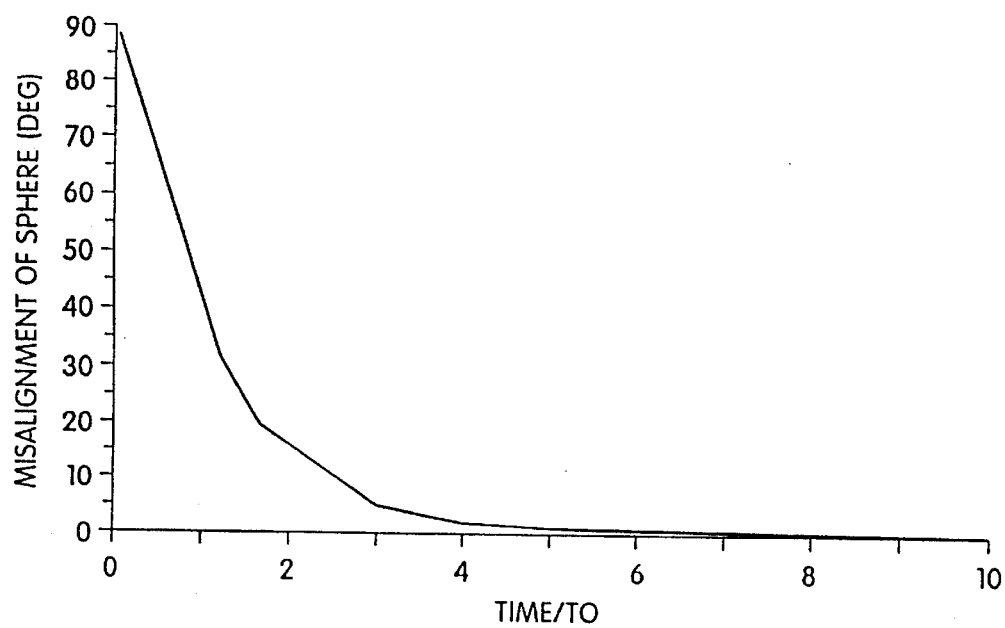
FIG. 15 is a graph of the effect of an applied electric field on junction orientation.

Two solutions to this equation will be presented. In the first the induced torque on the sphere and the rotational inertia are assumed insignificant. This leads to the simplified equation (12) with solution given in equations (13–14) and plotted in FIG. 15.

$$\sigma w E \sin\theta = \frac{16}{3} \mu R \dot\theta \quad (12)$$

$$\theta = 2a\tan[\tan(\theta_o/2)\exp(t/t_o)] \quad (13)$$

$$t_o = \frac{16\mu R}{3\sigma w E} \quad (14)$$

Figure 16:
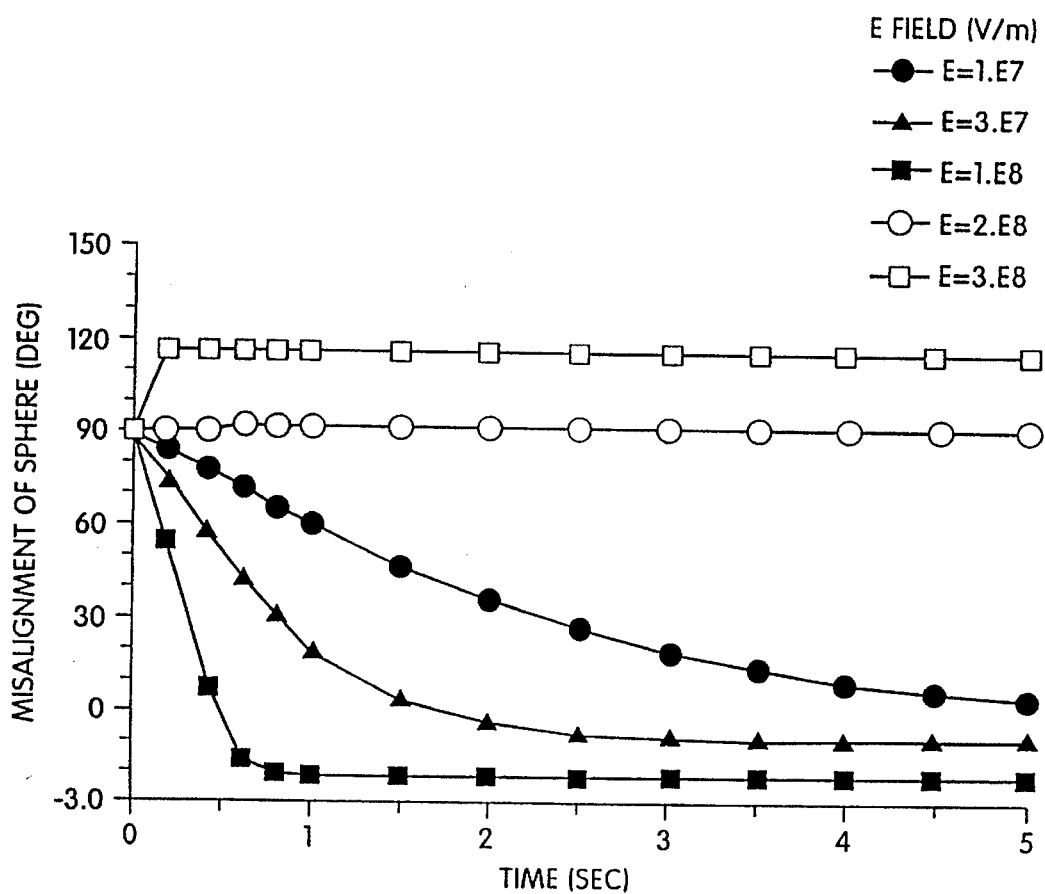
FIG. 16 is a graph of the effect on an applied electric field on junction orientation with junction asymmetry.

An exact solution to equation equation (11) can be found by numerical solution to the differential equation. Table 1 lists the assumed film parameters and FIG. 16 shows the resulting solution to the differential equation. There are clearly two different results.

First, when the applied electric field is low (<10⁵ V/m), the torque on the junction will dominate the induced torque. The junction will align properly but with a conventional plastic viscosity (~10⁴ kg/m-s) this can take too long (hours). An increase in the electric field and reduction in the viscosity can yield a solution with acceptable alignment time (~second).

TABLE 1

Parameters Assumed for FIG. 11

$\sigma$ = 4.5E-4
Y = 1.0E-2
$\omega$ = 3.3E-7
R = 5.0E-6

TABLE 1-continued

Parameters Assumed for FIG. 11

$\mu = 1.0\text{E-}2$
$\alpha = 45°$

The second result occurs when the electric field is too strong (>$10^8$ V/m) in which case the induced torque can dominate and the sphere aligns improperly. In all cases the rotational inertia of the sphere was found to be insignificant.

From equation (11) we can also see that reducing the radius of the sphere has two beneficial effects. It reduces the torque from the asymmetry of the sphere and the torque due to viscosity.

Referring now to FIG. 17A, microspheres can be provided in a process in which molten silicon 120 is ejected from a nozzle 122 and is subjected to argon jets 124 so as to provide the microspheres 126.

Referring now to FIG. 17B, to provide microspheres microballoons 130 are produced by in a chamber 132 via a chemical reaction and accretion.

Referring now to FIG. 17C, microspheres 140 can also be formed by doping a wafer 140, dicing the wafer as illustrated at 142 to provide micron size particles 144, shown in top view at 146.

Referring now to FIG. 17D, microspheres of silicon can be formed in a fluidized bed process. Mesh 150 is subjected to a gas stream 152 in an upward direction as illustrated to provide microspheres 154.

Referring now to FIG. 17E, a boule of silicon 160 may be fragmented or ablated through the utilization of an electric arc 162 provided by an electrode 164 in which boule 160 is rotated in the direction of arrow 166.

Finally, referring to FIG. 17F, a disc of silicon 170 may be laser ablated to knock off particles 172 through the utilization of a laser 174.

Figure 18:
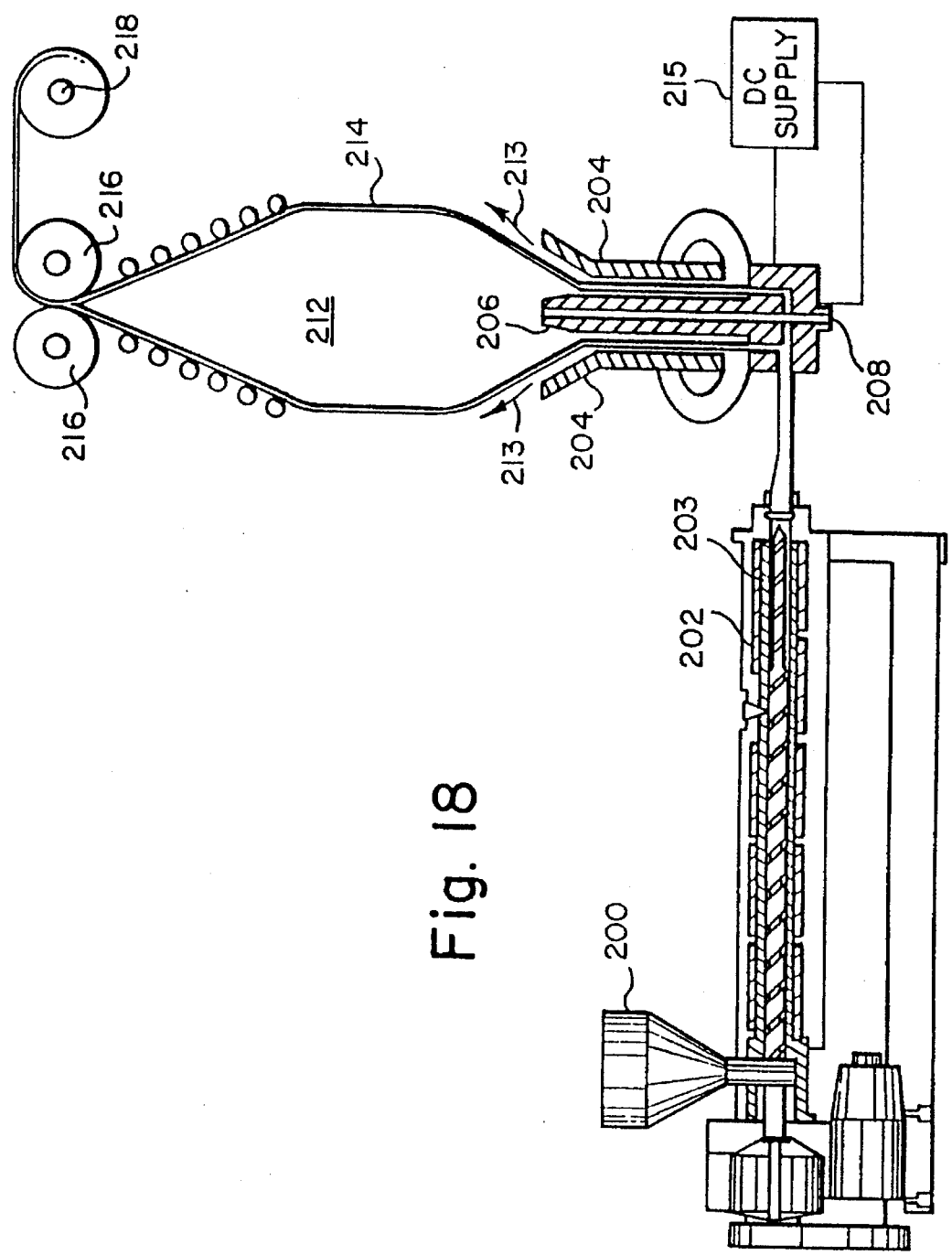
FIG. 18 illustrates one embodiment of a blow-forming operation for the formation of film.

Referring now to FIG. 18, one method of forming a thin film is through a blown film extrusion operation in which granular material in hopper 200 is fed into an extruder 201 which is a screw-like device. As the material is conveyed by the screw past a heated portion 202 of the barrel 203 a molten film forms on the inside diameter of the barrel. As the mixture of molten and granular material is transported by the screw, energy derived from sheering of this melt film is responsible for melting the remainder of the material.

The molten material exits the extruder and enters a set of concentric die lips 204 and 206. Air is introduced at 208 into the tube to inflate it, creating a void 212 and stretching the material to the desired thickness. A second stream of air 213 is directed around the outside of the "bubble" 214 to cool and solidify the melt. It will also be appreciated that as the walls are formed, the active devices within the melt may be oriented by appropriately charging walls 204 and 206 of the die lips as illustrated by the provision of a DC supply 215 connected as illustrated.

Note that once the film has solidified it is folded flat by pinch rollers 216 and rolled up on a high speed winder 218.

Figure 19:
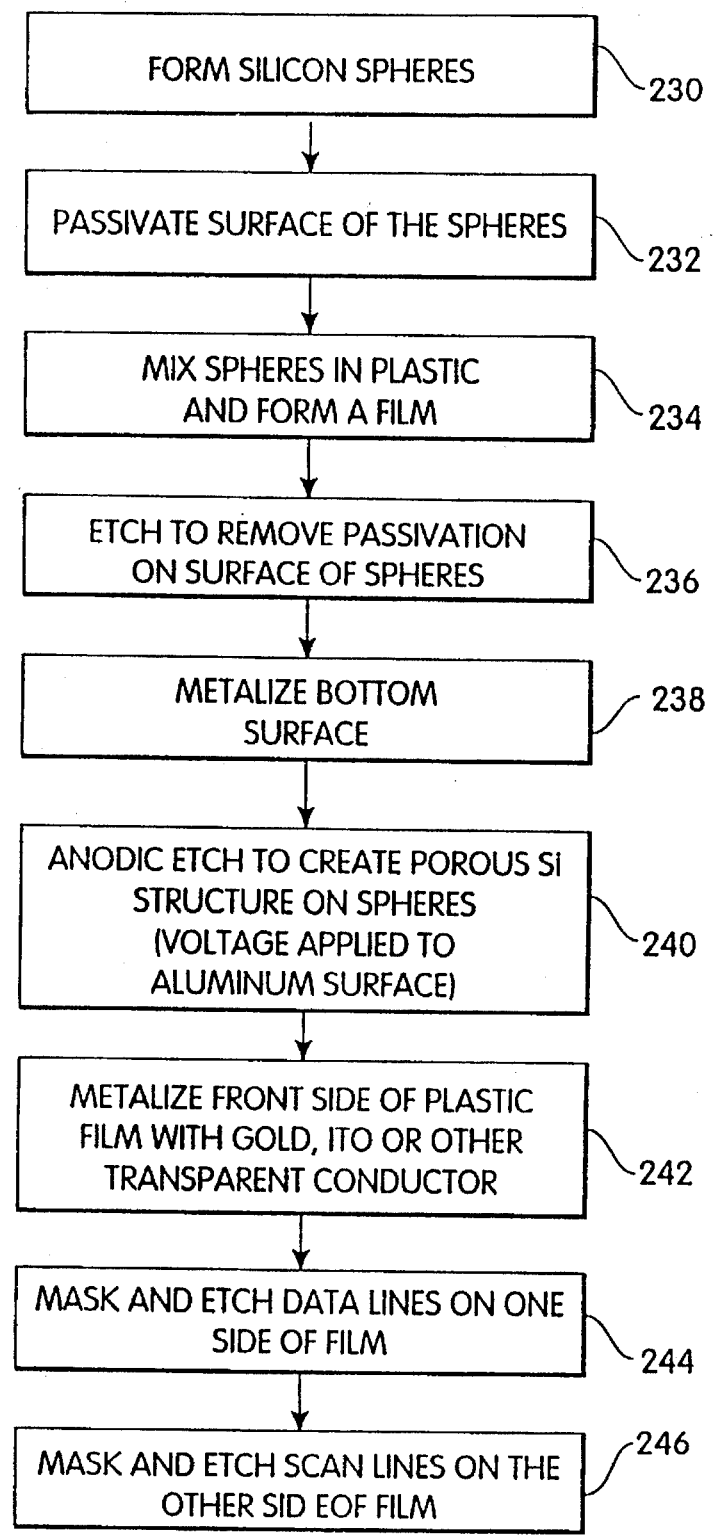
FIG. 19 is a flow chart illustrating the formation of electroluminescent porous silicon spheres with anodic etchant to create the porous silicon structure.

Referring now to FIG. 19, electroluminescent porous silicon spheres can be produced as follows. The first step is to form silicon spheres by any convenient means as illustrated at 230. Thereafter it is important to passivate the surface of the spheres as illustrated 232 and to then to mix the spheres in plastic to form a film as illustrated 234. After the spheres are mixed in the film and the film has been formed, then the top surfaces of the spheres are chemically treated to remove passivation as illustrated 236. It will be appreciated that the spheres are intended to extend above and below the surfaces of the formed film. As illustrated at 238, the bottom surface of the film is metallized to provide an electrode for the acceleration of charged etchant.

The next step is to subject the exposed top surfaces of the spheres to a charged etchant via an anodic etch step to create the porous silicon as illustrated at 240. In order to create this anodic development, the bottom layer of the film is metallized as mentioned above.

In one embodiment, hydroflouric acid is utilized in the etching process to provide the microporous structure at least in the top surface of each sphere. It will then be appreciated as illustrated at 242 that the front side of the plastic is metalized with a patterned transparent conductor, with patterning of the data lines on one side of the film being formed in a step illustrated at 244, and with the scan lines being formed on the other side of the film as illustrated at 246.

Figure 20A:
FIGS. 20A–20E are diagrammatic and sectional views illustrating the fabrication of the porous silicon elements after the silicon spheres are first imbedded in the flexible sheet.
Figure 20B:
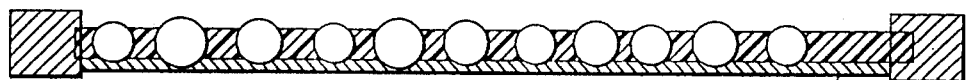
Figure 20C:
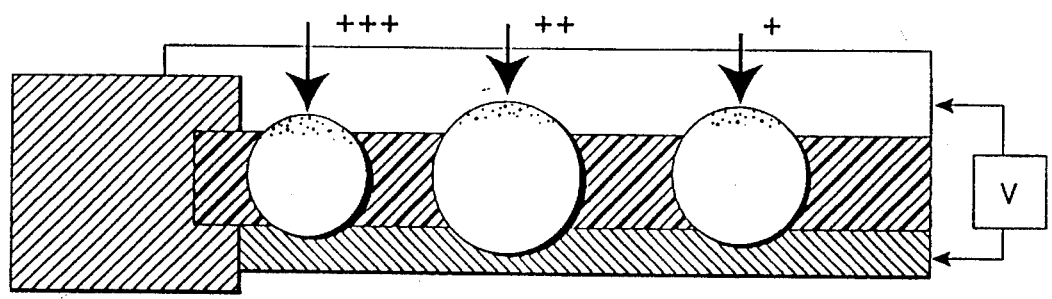
Figure 20D:
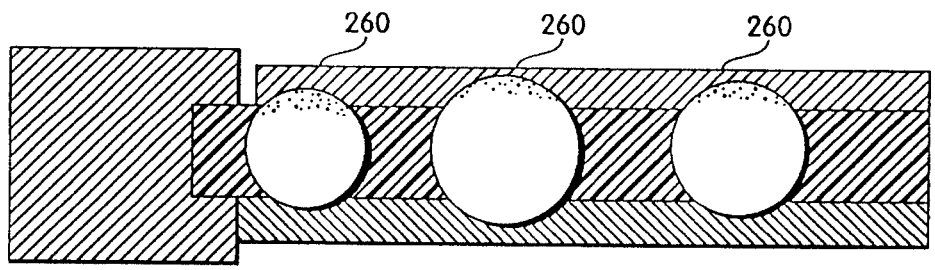

Referring now to FIG. 20A, in section the completed film 250 is shown with imbedded silicon spheres 252. As seen in FIG. 20B, a metalized layer 254 is deposited on the back of the film 250, whereas as shown in FIG. 20C a charged etchant contacts the top surfaces of the spheres.

Referring now to 20D, metallization 260 is patterned as desired.

Figure 20E:
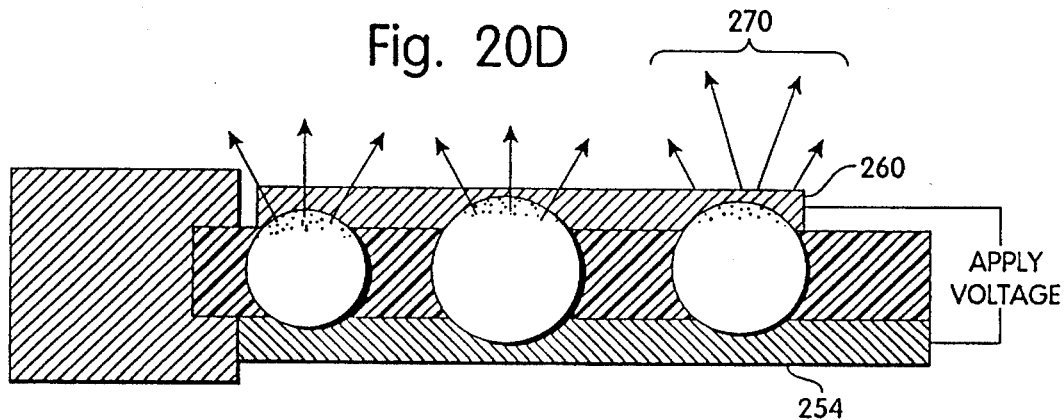

As can be seen in connection with FIG. 20E, when a voltage is applied between conductor 260 and conductor 254, which may be of course a patterned conductor, the microscopic etching results in emitted light 270 from the element or elements sandwiched in between the activated electrodes or conductors.

Note that several variations on the process for forming etched silicon sphere are described in E. Bassons, M. Freeman et al. Characterization of Microporous Silicon Fabricated by Immersion Scanning, Mat. Res. Soc. Symp. Proc., Vol 256, pp. 23–27, 1992. To date, the best results come from anodic processes which apply a DC voltage between the silicon and a cathode.

Figure 21:
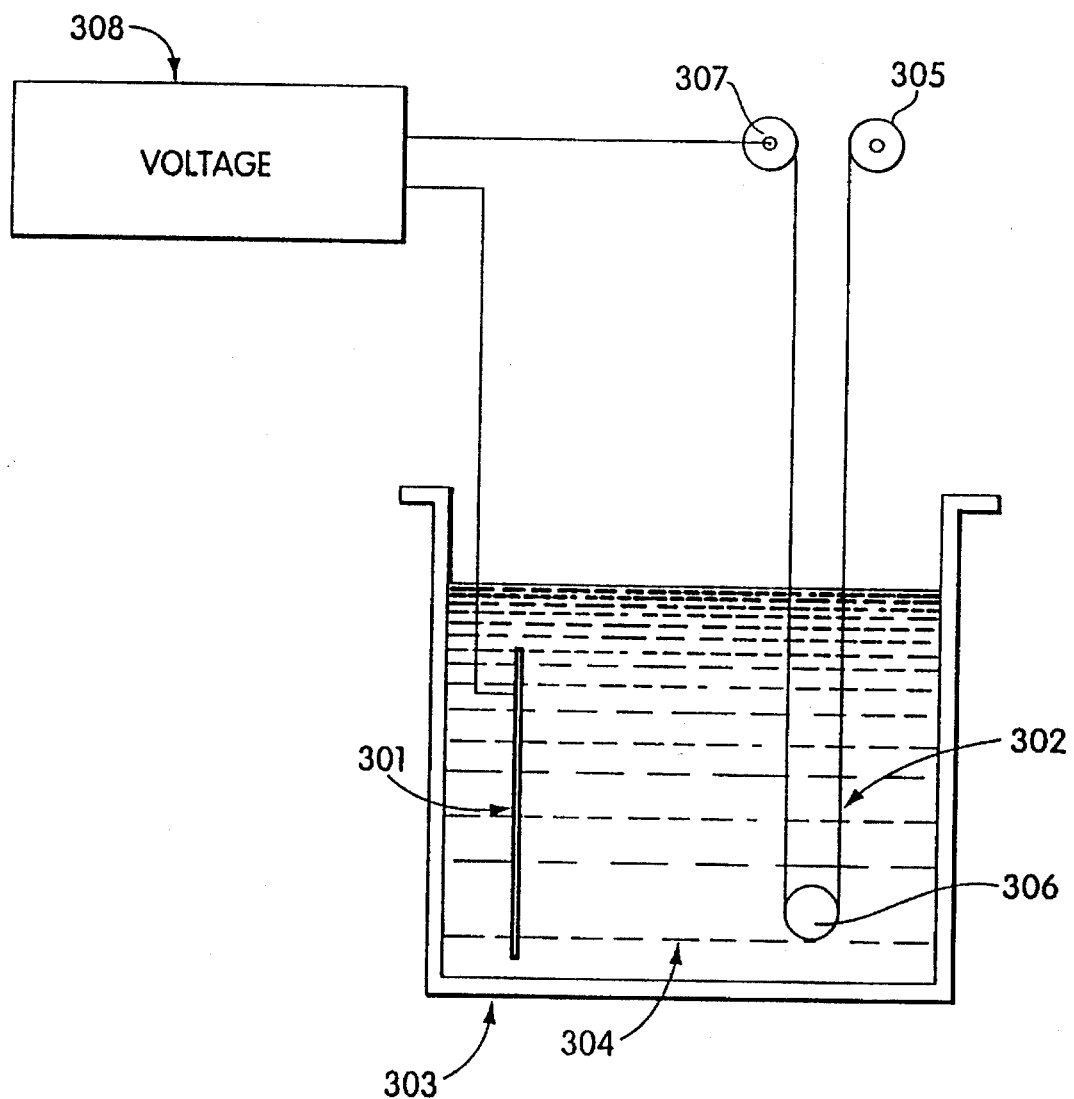
FIG. 21 is a diagrammatic illustration of an emersion scanning process for the formation of porous silicon spheres.

Referring now to FIG. 21, in such an anodic process a platinum foil 301 cathode and the metalized film 302 containing the Si spheres and forming an anode are held vertically in an open vessel 303 containing 10–25% aqueous HF solution 304. The Si film is mechanically cycled in and out of the electrolyte by the use of rollers 305 and 307 at a programmable rate during anodization. During this process a voltage is applied between the platinum foil 301 and Si film 302 by use of an external voltage source 308.

In summary, the subject method includes producing flat panel TV screens using inexpensive plastic film production methods called the "extended film" process, as opposed to the expensive film deposition processes currently used in circuit fabrication. The extended film process solves the problems of component yield, correlation of component failures and mask registration currently faced in the production of flat panel displays.

Thus, a method is provided for integrating active components in a thin flexible plastic film to provide an exceptionally large continuous display in which the film contains densely distributed luminescent devices, light emitting diodes or liquid crystal elements addressed by a grid of transparent conductors. Inexpensive bulk processing techniques are used to produce plastic film with embedded components completely through the film. This topological layout provides mass redundancy of components, spatial decorrelation of component yields, and dramatic reduction in registration problems of metallic interconnects. The subject panel is especially well adapted to inexpensive flat panel TV screens or exceptionally large flat panel displays whose geometry is not limited to flat surfaces, but may take on curved or cylindrical configurations. The active element flexible film design can be used for electroluminescent tape for automotive pin striping and signage; for flexible glue-on displays and for video displays such as workstations, MDTV, theater screens and billboards.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. An extended film display, comprising a flexible film having two opposing sides;

a pair of crossed electrodes, one on each different ones of said opposing sides of said film;

a number of light-emitting elements dispersed in said film, said elements extending from one side of said film to the other, said elements being sandwiched between a crossover between said crossed electrodes and being sufficiently small to permit numbers of said elements to exist at said crossover, whereby activation of said electrodes at said crossover activates numbers of said elements therebetween; and means including said crossed electrodes for selectively activating said elements.

2. The display of claim 1, wherein said elements each have at least one p/n junction and wherein said elements have their associated p/n junctions aligned in the plane of said film.

3. The display of claim 2, wherein said elements are oriented by embedding said elements in said film when said film is soft and by subjecting said elements in said soft film to an electrostatic field.

4. The display of claim 1, wherein said elements are spherical.

5. The display of claim 1, wherein said elements are micron-sized.

6. The display of claim 1, wherein said elements are microporous silicon elements.

7. The display of claim 6, wherein said microporous silicon elements are spherical.

8. The display of claim 1, wherein said means for selectively activating said elements include crossed electrodes, said electrodes having widths at least twice the mean diameter of said elements, whereby more than one element resides at an intersection of said crossed electrodes.

9. The display of claim 1, wherein said elements are made by gas atomization.

10. The display of claim 1, wherein said elements are microballoons made by chemical action and accretion.

11. The display of claim 1, wherein said elements are made by dicing doped semiconductor wafers.

12. The display of claim 1, wherein said elements are made by subjecting a fluid fed to a gas stream to accrete spheres.

13. The display of claim 1, wherein said elements are made by subjecting a boule of semiconductor material to a dc arc.

14. The display of claim 1, wherein said elements are made by ablating semiconductor material with a laser.

15. The display of claim 1, wherein said elements are spherical silicon and wherein said spherical silicon spheres are made to emit light through microetching at least a portion of the surface thereof to produce micropores.

16. The display of claim 15, wherein said microetching is accomplished through the use of hydroflouric acid.

* * * * *